United States Patent
Pang et al.

(10) Patent No.: US 6,194,628 B1
(45) Date of Patent: Feb. 27, 2001

(54) METHOD AND APPARATUS FOR CLEANING A VACUUM LINE IN A CVD SYSTEM

(75) Inventors: Ben Pang, Oakland; David Cheung, Foster City; William N. Taylor, Jr., Dublin; Sebastien Raoux, San Francisco; Mark Fodor, Los Gatos, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 08/533,174

(22) Filed: Sep. 25, 1995

(51) Int. Cl.$^7$ .......................................................... B09B 3/00
(52) U.S. Cl. ................... 588/900; 588/244; 96/3; 118/722; 118/723 R; 118/723 VE; 118/723 MW; 118/725; 118/723 MR; 118/723 MA
(58) Field of Search .................. 118/722, 723 R, 118/723 VE, 723 MW, 725, 723 MR, 723 MA; 96/3; 588/900, 244

(56) References Cited

U.S. PATENT DOCUMENTS

| 4,608,063 | * | 8/1986 | Kurokawa ............................ 118/728 |
| 4,657,738 | | 4/1987 | Kanter et al. .................... 422/186.04 |

(List continued on next page.)

FOREIGN PATENT DOCUMENTS

| 1282732A | 9/1991 | (CA) . |
| 43 19 118 A1 | 6/1993 | (DE) . |
| 4319118A1 | 12/1994 | (DE) . |
| 0158823 A2 | 10/1985 | (EP) . |
| 0176295 | 4/1986 | (EP) . |
| 0 289 858 A1 | 4/1988 | (EP) . |
| 0 296 720 A2 | 12/1988 | (EP) . |
| 0 296 720 A3 | 12/1988 | (EP) . |
| 0 767 254 A1 | 4/1997 | (EP) . |
| 51-129868 | 11/1976 | (JP) . |
| 52-78176 | 7/1977 | (JP) . |
| 58-101722 | 6/1983 | (JP) . |
| 59-181619 | 10/1984 | (JP) . |
| 60-234313 | 11/1985 | (JP) . |
| 63-28869 | 2/1988 | (JP) . |
| 1-288355 | 11/1989 | (JP) . |
| 2-125876 | 5/1990 | (JP) . |
| 4-136175 | 5/1992 | (JP) . |
| 5-202474 | 8/1993 | (JP) . |
| 9-010544 | 1/1997 | (JP) . |
| WO 80/01363 | 7/1980 | (WO) . |
| 8001363 | * | 7/1980 | (WO) . |

OTHER PUBLICATIONS

Lieberman et al., "Principles of Plasma Discharges and Materials Processing", *Library of Congress Cataloging in Publication Data*, pp. 404–410, (1994).

(List continued on next page.)

Primary Examiner—Marianne M. Cintins
Assistant Examiner—C. Delacroix-Muirheid
(74) Attorney, Agent, or Firm—Townsend, Townsend & Crew

(57) ABSTRACT

An apparatus for preventing particulate matter and residue build-up within a vacuum exhaust line of a semiconductor processing device. The apparatus uses RF energy to form excite the constituents of particulate matter exhausted from a semiconductor processing chamber into a plasma state such that the constituents react to form gaseous products that may be pumped through the vacuum line. The apparatus may include a collection chamber structured and arranged to collect particulate matter flowing through the apparatus and inhibiting egress of the particulate matter from the apparatus. The apparatus may further include an electrostatic collector to enhance particle collection in the collection chamber and to further inhibit egress of the particulate matter.

40 Claims, 7 Drawing Sheets

U.S. PATENT DOCUMENTS

| | | | |
|---|---|---|---|
| 4,735,633 | | 4/1988 | Chiu ............................................ 55/2 |
| 4,816,046 | | 3/1989 | Maeba et al. .......................... 55/209 |
| 5,000,113 | * | 3/1991 | Wang et al. ........................... 118/723 |
| 5,141,714 | | 8/1992 | Obuchi et al. ........................ 422/174 |
| 5,211,729 | | 5/1993 | Sherman ................................ 55/186 |
| 5,323,013 | | 6/1994 | Kelly et al. ......................... 250/522.1 |
| 5,417,826 | | 5/1995 | Blalock ................................. 204/176 |
| 5,451,378 | | 9/1995 | Russell et al. ..................... 412/186.3 |
| 5,453,125 | * | 9/1995 | Krogh .......................... 118/723 MR |
| 5,453,305 | | 9/1995 | Lee ....................................... 427/562 |
| 5,827,370 | * | 10/1998 | Gu ........................................ 118/715 |

OTHER PUBLICATIONS

W.H. Hayward, "Introduction to Radio Frequency Design", *Library of Congress Cataloging in Publication Data*, pp. 135–137, (1982).

Danielson et al., "Use DryScrub to Improve Hot Wall Nitride Equipment Reliability", *Product Application Report*, pp. 1–6 No Year Given.

Singer et al., "Pre–pump Scrubbers Simplify Maintenance and Improve Safety", *Semiconductor International*, pp. 1–3 No Year Given.

Mocella et al., "Options for Environmentally Impacted Perfluorinated Gases Used in Plasma Processing", *10th Symposium Plasma Etching*, pp. 192–200 (1994).

Mocella et al., "Etch Process Characterization Using Neural Network Methodology: A Case Study", *SPIE Process Module Metrology, Control, and Clustering*, vol. 1594, pp. 232–242 (1991).

Mohindra et al., "Abatement of Perfluorocompounds (PFCs) in a Microwave Tubular Reactor Using $O_2$ As An Additive Gas", *Department of Chemical Engineering, MIT*, pp. 1–59 No Year Given.

U.S. application No. 08/741,230, Pang et al., filed Oct. 30, 1996.

U.S. application No. 08/741,241, Raoux et al., filed Oct. 30, 1996.

U.S. application No. 08/741,272, Cheung et al., filed Oct. 30, 1996.

* cited by examiner

METHOD AND APPARATUS FOR CLEANING A VACUUM LINE IN A CVD SYSTEM

BACKGROUND OF THE INVENTION

The present invention relates generally to the field of semiconductor processing equipment and more specifically to a method and apparatus for eliminating contaminants and residues from inside a vacuum exhaust line connected to a processing chamber.

During chemical vapor deposition (CVD) processing, deposition gases are released inside a processing chamber to form a thin film layer on the surface of a substrate being processed. Unwanted deposition on areas such as the walls of the processing chamber also occurs during such CVD processes. Because the residence time in the chamber of individual molecules in these deposition gases is relatively short, however, only a small portion of the molecules released into the chamber are consumed in the deposition process and deposited on either the wafer or chamber walls.

The unconsumed gas molecules are pumped out of the chamber along with partially reacted compounds and reaction byproducts through a vacuum line that is commonly referred to as the "foreline." Many of the compounds in this exhausted gas are still in highly reactive states and/or contain residues or particulate matter that can form unwanted deposits in the foreline. Given time, this deposition build-up of powdery residue and/or particulate matter presents a serious problem. First, the build-up poses a safety threat in that the matter is often a pyrophoric substance that may ignite when the vacuum seal is broken and the foreline is exposed to ambient conditions during standard, periodic cleaning operations. Second, if enough of the deposition material builds-up in the foreline, the foreline and/or its associated vacuum pump may clog if it is not appropriately cleaned. Even when periodically cleaned, matter build-up interferes with normal operation of the vacuum pump and can drastically shorten the useful life of the pump. Also, the solid matter may backwash from the foreline into the processing chamber and contaminate processing steps adversely effecting wafer yield.

To avoid these problems, the inside surface of the foreline is regularly cleaned to remove the deposited material. This procedure is performed during a standard chamber clean operation that is employed to remove unwanted deposition material from the chamber walls and similar areas of the processing chamber. Common chamber cleaning techniques include the use of an etching gas, such as fluorine, to remove the deposited material from the chamber walls and other areas. The etching gas is introduced into the chamber and a plasma is formed so that the etching gas reacts with and removes the deposited material from the chamber walls. Such cleaning procedures are commonly performed between deposition steps for every wafer or every N wafers.

Removal of deposition material from chamber walls is relatively straight forward in that the plasma is created within the chamber in an area proximate to the deposited material. Removal of deposition material from the foreline is more difficult because the foreline is downstream from the processing chamber. In a fixed time period, most points within the processing chamber come in contact with more of the etchant fluorine atoms than do points within the foreline. Thus, in a fixed time period, the chamber may be adequately cleaned by the clean process while residue and similar deposits remain in the foreline.

To attempt to adequately clean the foreline, the duration of the clean operation must be increased. Increasing the length of the clean operation, however, is undesirable because it adversely effects wafer throughput. Also, such residue build-up can be cleaned only to the extent that reactants from clean step are exhausted into the foreline in a state that they may react with the residue in the foreline. In some systems and applications, the residence time of the exhausted reactants is not sufficient to reach the end or even middle portions of the foreline. In these systems and applications, residue build-up is even more of a concern. Accordingly, there is a need for an apparatus for efficiently and thoroughly cleaning the foreline in a semiconductor processing system and a method of doing the same.

One approach that has been employed to clean the foreline relies on a scrubbing system that uses plasma enhanced CVD techniques to extract reactive components in the exhaust gas as film deposits on electrode surfaces. The scrubbing system is designed to maximize the removal of reactants as a solid film and uses large surface area spiral electrodes. The spiral electrodes are contained within a removable canister that is positioned near the end of the foreline between the blower pump and mechanical pump. After a sufficient amount of solid waste has built up on the electrodes, the canisters may be removed for disposal and replacement.

Problems exist in this prior art method in that the system relies on the large surface area of the electrodes to provide an area for deposited solid matter to collect. To accommodate the large surface area of the electrodes, the system is necessarily large and bulky. Furthermore, extra expenses are incurred in the operation of this prior art scrubber system since the removable canister is a disposable product that must be replaced and properly disposed. Also, the scrubbing system is located downstream from a beginning portion of the vacuum foreline and thus does not ensure removal of powdery material or particulate matter that builds-up in this portion of the line.

SUMMARY OF THE INVENTION

The present invention solves the above problems of the prior art by providing an apparatus that substantially prevents particulate matter and other residual material from building up in an exhaust line. Powder residue and other particulate matter that would otherwise collects in the vacuum line during deposition steps is trapped in a collection chamber and removed through a plasma formed downstream of the reaction chamber. The plasma is formed from reactants in the exhaust residues and exhaust gases pumped through the collection chamber. Constituents from the plasma react to form gaseous products that are readily pumped through and out of the exhaust line. The invention also provides a method for preventing the formation of and ensuring removal of such deposition material.

In one embodiment of the apparatus of the present invention, a coil surrounds a gas passage way defined by a vessel chamber. The coil is connected to an RF power supply that is used to excite molecules from particulate matter and residue within the passageway into a plasma state. Constituents from the plasma react to form gaseous products that may be pumped through the vacuum line.

In another embodiment of the apparatus of the present invention, the passage way includes a collection chamber between an inlet and outlet of the vessel. The collection chamber is structured and arranged to collect particulate matter flowing through the passage way and inhibit egress of the particulate matter from the collection chamber. Particles trapped in the collection chamber are excited into a plasma state by an RF as described above.

In still another embodiment, the apparatus of the present invention further includes an electrostatic collector positioned within the gas passage way. The electrostatic collector is designed to collect and trap within the passage way electrically charged particulate matter flowing through the passage way.

These and other embodiments of the present invention, as well as its advantages and features are described in more detail in conjunction with the text below and attached figures.

DETAILED DESCRIPTION OF THE PREFERRED EMBODIMENTS

I. Exemplary Semiconductor Processing Chamber

Figure 1:
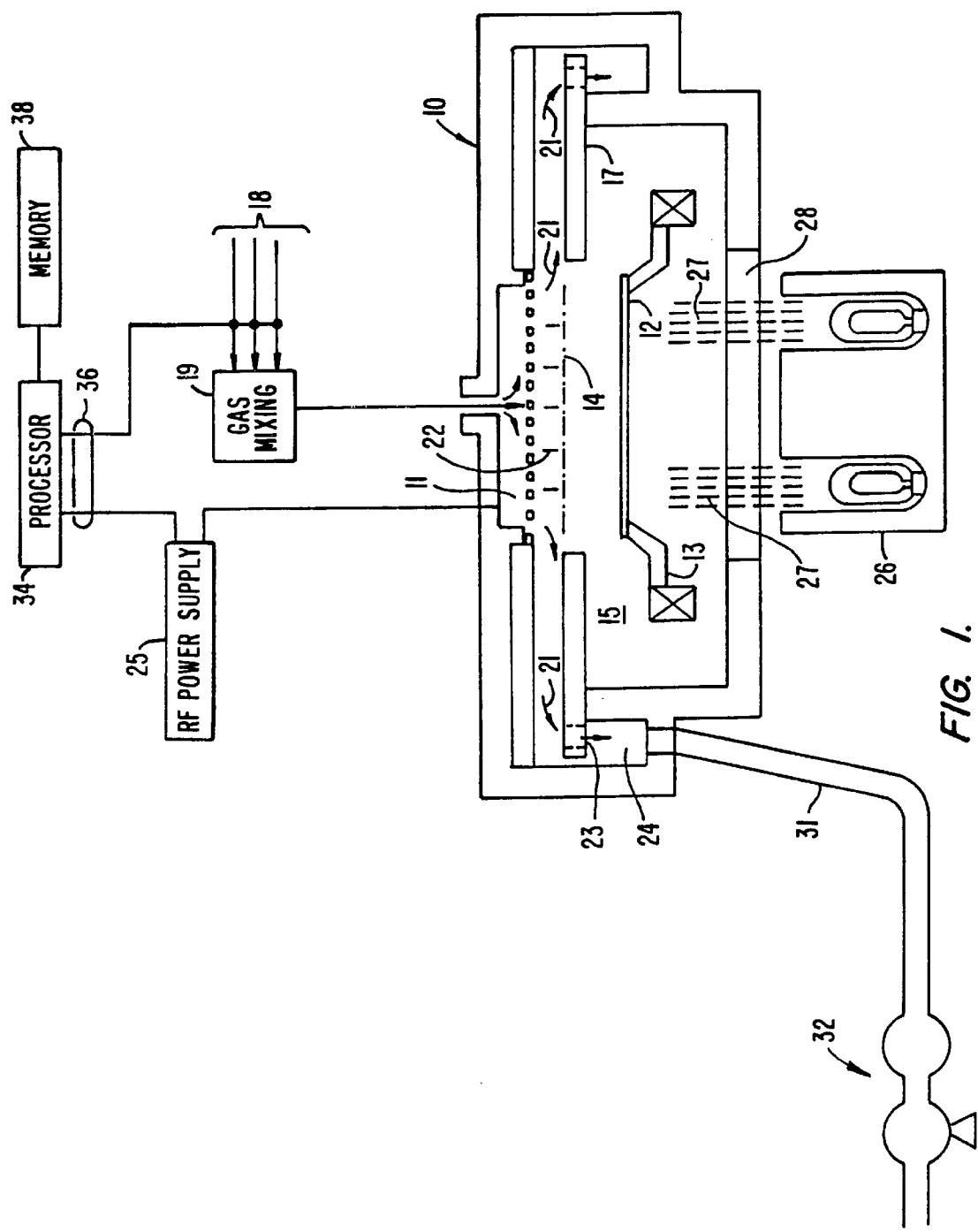
FIG. 1 illustrates one embodiment of a simplified chemical vapor deposition apparatus to which the apparatus of the present invention may be attached.

The apparatus of the present invention can be used in conjunction with a variety of different semiconductor processing devices. One suitable device, a chemical vapor deposition machine, is shown in FIG. 1 which is a vertical, crosssectional view of a simplified, parallel plate chemical vapor deposition reactor 10. Reactor 10 includes a gas distribution manifold 11 for dispersing deposition gases to a wafer, not shown, that rests on a susceptor 12 in a vacuum chamber 15. Susceptor 12 is highly thermally responsive and is mounted on support fingers 13 so that susceptor 12 (and the wafer supported on the upper surface of susceptor 12) can be controllably moved between a lower loading/off-loading position and an upper processing position 14 which is closely adjacent manifold 11.

When susceptor 12 and the wafer are in processing position 14, they are surrounded by a baffle plate having a plurality of spaced holes 23 which exhaust into an annular vacuum manifold 24. During processing, gas inlet to manifold 11 is uniformly distributed radially across the surface of the wafer as indicated by arrows 21. The gas is then exhausted via ports 23 into the circular vacuum manifold 24 and through a vacuum foreline 31 by a vacuum pump system 32. Before reaching manifold 11, deposition and carrier gases are supplied through gas lines 18 into a mixing chamber 19 where they are combined and then sent to manifold 11.

A controlled plasma is formed adjacent to the wafer by RF energy applied to manifold 11 from RF power supply 25. Gas distribution manifold 11 is an RF electrode, while susceptor 12 is grounded. RF power supply 25 can supply either single or mixed frequency RF power (or other desired variations) to manifold 11 to enhance the decomposition of reactive species introduced into chamber 15.

A circular external lamp module 26 provides a collimated annular pattern of light 27 through quartz window 28 onto an annular outer peripheral portion of susceptor 12. Such heat distribution compensates for the natural heat loss pattern of the susceptor and provides rapid thermal and uniform susceptor and wafer heating for effecting deposition.

A motor, not shown, raises and lowers susceptor 12 between a processing position 14 and a lower, wafer-loading position. The motor, gas supply valves (not shown) connected to gas lines 18 and RF power supply 25 are controlled by a processor 34 over control lines 36 of which only some are shown. Processor 34 operates under the control of a computer program stored in a memory 38. The computer program dictates the timing, mixture of gases, chamber pressure, chamber temperature, RF power levels, susceptor position, and other parameters of a particular process.

Typically, any or all of the chamber lining, gas inlet manifold faceplate, support fingers 13, and various other reactor hardware is fabricated from material such as anodized aluminum. An example of such a PECVD apparatus is described in U.S. Pat. No. 5,000,113 entitled "Thermal CVD/PECVD Reactor and Use for Thermal Chemical Vapor Deposition of Silicon Dioxide and In-situ Multi-step Planarized Process," which is commonly assigned.

The above reactor description is mainly for illustrative purposes, and the present invention may be used with other CVD equipment such as electron cyclotron resonance (ECR) plasma CVD devices, induction coupled RF high density plasma CVD devices, or the like. The present invention may also be used with thermal CVD devices, plasma etching devices and physical vapor deposition devices. The apparatus of the present invention and the method for preventing deposition build-up within a vacuum line is not limited to any specific semiconductor processing apparatus or to any specific deposition or etching process or method.

II. Exemplary Semiconductor Processing Operations

During semiconductor processing operations such as chemical vapor deposition processes carried out by CVD reactor 10, a variety of gaseous waste products and contaminants are exhausted from vacuum chamber 15 into vacuum line 31. Depending on the particular operation being performed, these exhaust products may include particulate matter such as partially reacted products and byproducts that leaves a residue or similar powdery material within the foreline as it is exhausted through the foreline. For example, during the deposition of a silicon nitride film using silane ($SiH_4$), nitrogen ($N_2$) and ammonia ($NH_3$) as precursors, residue in the form of a brown powder composed of $Si_xN_yH_z$, $Si_xH_y$, $SiO_x$ and elemental silicon has been observed in the foreline. It is believed that this residue build-up is from half-reacted byproducts of the reaction of $SiH_4+N_2+NH_3$. Similar residues are also formed during the deposition of silicon nitride layers using other precursor gases or liquids such as disilane ($S_2H_6$) or organic sources. Residue build-up may also occur during the deposition of oxynitride films and silicon oxide films among other layers and may also occur during plasma etching and other process steps.

The present invention prevents build-up of such residues and particulate matter by trapping the particulate matter in a collection chamber and exciting reactant gases exhausted through the vacuum foreline and the residual and particulate matter within the line into a plasma state. The plasma reacts with and etches residues and particulate matter that tends to build-up in the foreline to form gaseous products and byproducts that may be pumped through the vacuum line without forming deposits or condensing within the line.

III. Exemplary Embodiments of the Present Invention

Figure 2:
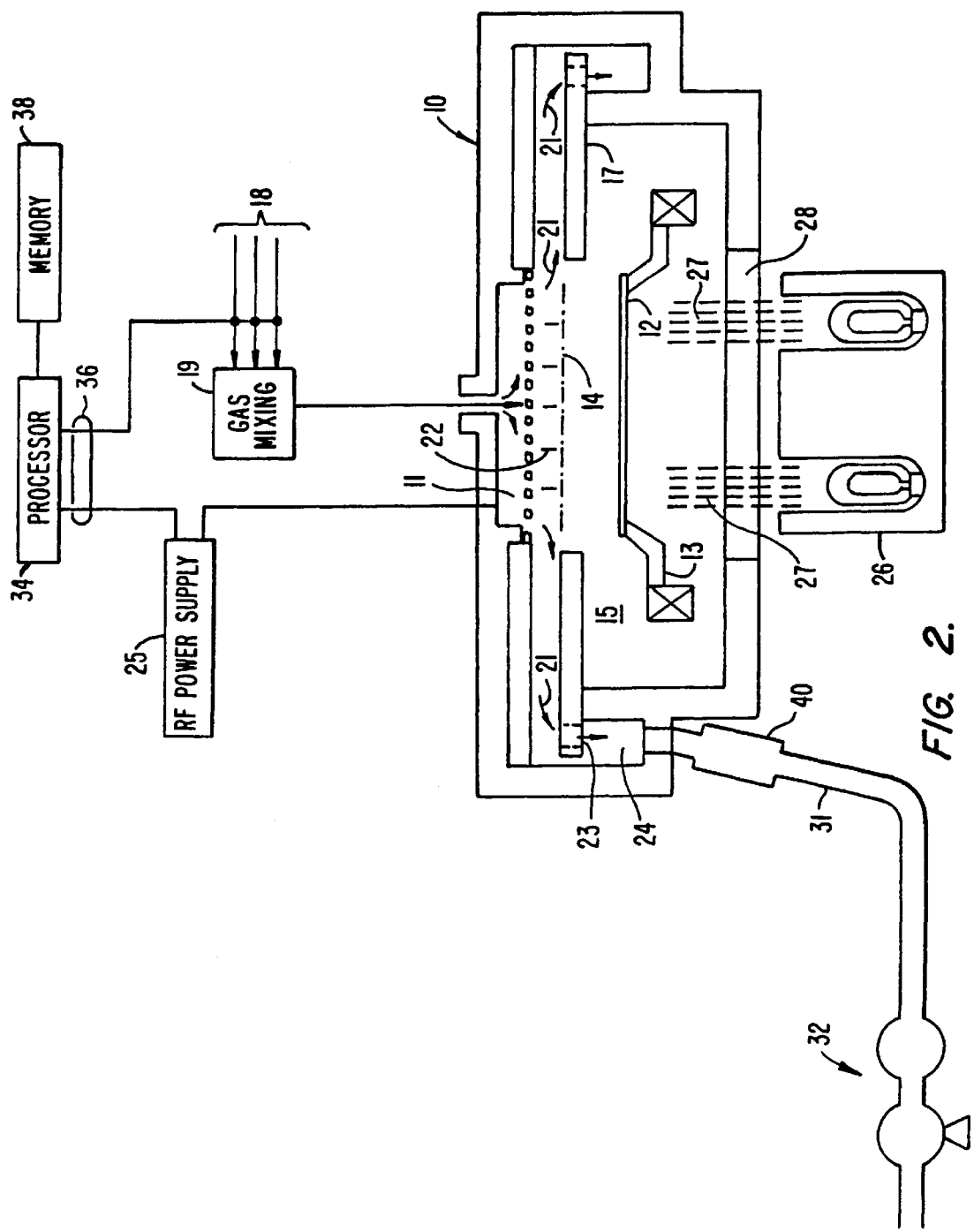
FIG. 2 illustrates one method of connecting the present invention to the chemical vapor deposition apparatus of FIG. 1.

As shown in FIG. 2, which is a vertical, cross-sectional view of the simplified CVD apparatus of FIG. 1 fitted with the apparatus of the present invention, the apparatus of the present invention is positioned downstream from the exhaust gas source—the processing chamber. The apparatus may either connect to or replace a portion of the vacuum foreline.

In FIG. 2, a downstream plasma cleaning apparatus 40 (hereinafter referred to as "DPA 40" or "the DPA") is fitted between vacuum pump system 32 and vacuum manifold 24 along a portion of vacuum line 31. Because of its position, gases exhausted from vacuum chamber 15 necessarily passes through DPA 40. DPA 40 may be positioned at any location along vacuum line 31, but preferably, DPA 40 is positioned as close as possible to exhaust manifold 24 so that gases exhausted from chamber 15 pass through DPA 40 before passing through any portion of vacuum line 31.

In operation, as deposition gases are exhausted from vacuum chamber through vacuum line 31, particulate matter and residue from the gases are deposited on the interior surface of the vacuum line. Removal of the particulate matter and residues may be achieved by activating DPA 40. For such removal, DPA 40 may be turned ON during both deposition and clean operations or may be activated only during the clean procedure.

When activated, DPA 40 creates a voltage field that excites molecules of residual matter deposited on the interior surfaces of the DPA and molecules of exhaust gases passing through the DPA into a plasma state. The plasma enhances decomposition of the matter within DPA 40 into gaseous products and byproducts that may be pumped out through the foreline thus preventing particle deposition or residue build-up. For example, in the case where residue build-up within DPA 40 is in the form of the brown powder comprising $Si_xN_yH_z$, $Si_xH_y$, $SiO_x$ and elemental silicon as described above in respect to silicon nitride deposition, it is believed that the plasma formed by DPA 40 breaks the residue down into gaseous components such as $SiF_4$, CO and $CO_2$, NO and $N_2O$, and $O_2$.

In addition to collecting residue by normal deposition within DPA 40, various embodiments of DPA 40 are specifically designed to trap particulate matter exhausted from chamber 15 within the DPA so that the matter cannot be deposited outside the DPA. Trapping is done using mechanical and/or electrostatic trapping mechanisms as described in more detail below. Once trapped, particulate matter remains in DPA 40 until it reacts with active species in the plasma to form gaseous byproducts that are then pumped through vacuum line 31.

The voltage field created within DPA 40 to form the plasma can be generated using a variety of known methods such as capacitively coupled electrodes, inductively coupled coils or ECR techniques. Because of its compact size and capacity to create relatively high voltage fields, it is preferable, however, to create the voltage field with an inductive coil such as a helical resonator coil. Such coils are well known to those of ordinary skill in the art and may be designed according to criteria set forth in any of a number of well known textbooks such as Michael A. Lieberman and Allan J. Lichtenberg, "Principles of Plasma Discharges and Materials Processing," pp. 404–410 John Wiley & Sons (1994), which is hereby incorporated by reference.

The helical resonator coil can be made out of a high conductivity type metal such as copper, nickel, or gold or similar conducting material. To properly resonate the coil, it is important that the length of the coil be about or slightly longer than ¼ of the wavelength of the applied RF signal. A coil of this length creates a stronger and more intense voltage field that further enhances decomposition.

The helical resonator coil is connected at one end to an RF power supply and at the opposing end to a ground potential. To ensure complete reaction of material passing through and/or deposited within DPA 40, the DPA must be driven by the RF power supply at a level sufficient to form a plasma. Generally, a power level of between 50–1000 Watts or more can be employed, and preferably a power level of between 100–400 Watts is used. The actual power level selected should be determined by balancing a desire to use a high power level to form an intense plasma and a desire to use a low power level to save energy costs and allow use of smaller, less expensive power supplies. Plasma uniformity and other characteristics important in conventional plasma enhanced CVD reactors are of secondary concern in the formation of the DPA plasma.

The power supply driving DPA 40 is operated at a frequency range from about 50 KHz to about 200 MHz or more and is usually operated in the range of about 50 KHz to 60 MHz. RF power supply can be supplied from either a single frequency RF source or a mixed frequency RF source. The power output of the supply will depend on the application for which the DPA is used and on the volume of the gas to be treated in DPA 40. RF power can be derived from RF power supply 25 or can be supplied by a separate RF power supply that drives only DPA 40. Additionally, assuming multiple processing chambers are present in a clean room, the multiple DPAs connected to the chambers may all be driven by a separate, dedicated DPA RF power supply that is connected to an appropriate number of RF power splitters.

The length and size of DPA 40 can vary. In some applications, DPA 40 can be only 4–6 inches long or even shorter, while in other applications, DPA 40 can be the entire length of vacuum line 31 (4–5 feet or longer) thus replacing the line. A longer DPA will collect and thus be able to remove more particulate matter than a shorter, identically designed DPA. DPA design must balance space considerations with residue collecting efficiency. Shorter DPAs that include an advanced trapping mechanism, however, are able to collect and trap 99.9% of all particulate matter exhausted from the processing chamber making length a less important factor. Because the length of the coil should be slightly longer than ¼ of the RF wavelength, there is a direct relationship between the coil length and RF frequency used. Longer coils require lower frequency RF power signals.

While it was previously described that DPA 40 may be turned ON and OFF during specific periods of a processing procedure, the DPA may also be configured as a passive device. As a passive device, DPA 40 is supplied continuously with a sufficient RF power signal so that no special control signals or processor time need be devoted to turning the DPA ON and OFF.

As previously mentioned, if configured as an active device, power is supplied to DPA 40 during the time at which a chamber clean operation takes place. Optionally, RF power may also be supplied during the period in which film deposition occurs in chamber 15. Control of the timing aspects of DPA 40 when configured as an active device is generally performed by processor 34 through the application of control signals sent over control lines 36.

Figure 3:
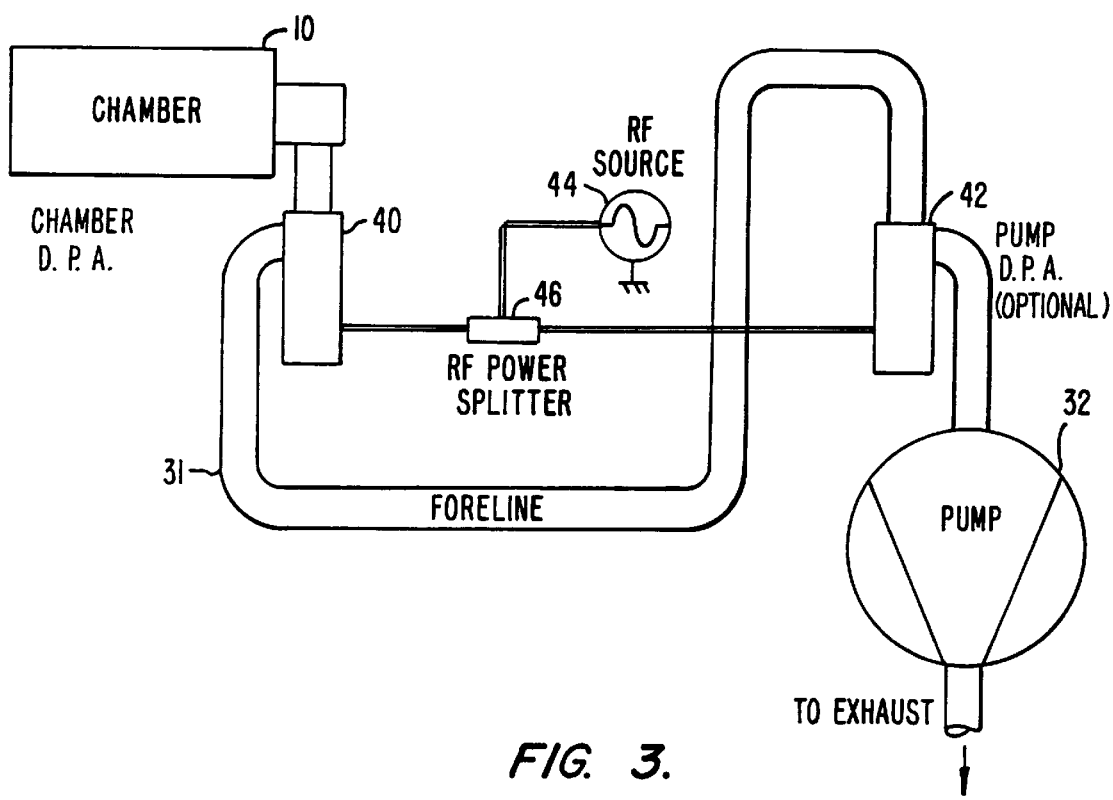
FIG. 3 illustrates a second method of connecting the present invention to the chemical vapor deposition apparatus of FIG. 1.

As shown in FIG. 3, it is possible to connect two or more DPAs to vacuum line 31. Such a configuration might be used, for example, to further protect vacuum pump 32 from residue build-up. In the configuration shown in FIG. 3, a second DPA 41 is positioned downstream from DPA 40 just before pump 32. If any particulate matter escapes DPA 40, the matter can be trapped and converted into gaseous form within DPA 42. DPA 40 and 42 can both be driven by a single RF power supply 44 with the power be being split by a splitter 46. Optionally, DPA 40 and 42 may each be driven by separate RF power supplies or may both be driven from the main RF power supply connected to processing chamber 10.

A number of different embodiments of the apparatus of the present invention may be constructed. Three such embodiments are illustrated below for exemplary purposes. In no way should it be construed that the present invention is limited to these specific embodiments.

1. Single Tube Embodiment

Figure 4:
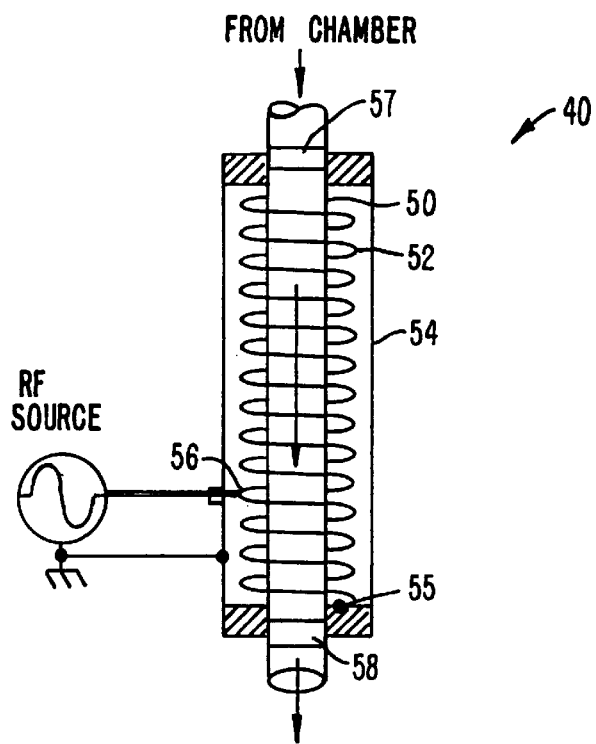
FIG. 4 is a side cross-sectional view of one embodiment of the vacuum line cleaning apparatus of the present invention.

FIG. 4 is a cross-sectional view of an embodiment of DPA 40. In FIG. 4, DPA 40 includes a tube 50 through which exhaust gases from processing chamber 15 flow as they pass through DPA 40. Tube 50 is a cylindrical tube made out of an insulating material such as ceramic, glass or quartz. In a preferred embodiment, tube 50 is made out of a ceramic material that is does not react with etchant gases, such as fluorine, used in the clean steps. Also, tube 50 has approximately the same interior diameter as the interior diameter of vacuum line 31. In other embodiments, tube 50 need not necessarily be in cylindrical form and may instead have angular, planar or elliptical or similarly curved interior surfaces. In these and other embodiments, the interior diameter of tube 50 may also be either larger or smaller than the interior diameter of vacuum line 31.

A coil 52 is wound around the exterior of tube 50 and connected to an RF power supply at point 56 and connected to a ground potential at point 57. Exhaust material passing through tube 50 and exhaust material deposited within the tube is excited into a plasma state by the application of a voltage from the RF power supply to coil 52. In the plasma state, constituents from the exhaust material react to form gaseous products that may be pumped out of DPA 40 and vacuum line 31 by pump system 32 as described above. Coil 52 is a standard helical resonator coil as previously discussed and may be wound within the interior of tube 50 rather than external to the tube.

An outer container 54 surrounds tube 50. Container 54 serves at least two purposes. First, it shields CVD processing apparatus 10 and other equipment from the voltage and noise signals generated by coil 52. Second, if ceramic tube 50 were to break or crack or if the vacuum seal in tube 50 is broken in another manner, container 54 provides a second seal preventing the exhaust gases from escaping. Container 54 can be made out of a variety of metals such as aluminum or steel or other compounds and is preferably grounded for shielding effect. Upper and lower flanges 57 and 58, respectively, connect DPA 40 to vacuum manifold 24 and vacuum line 31 while maintaining a vacuum seal.

Standard RF power supplies are designed to work off an impedance of 50 ohms as a load. Accordingly, the point of contact for the RF power supply to coil 52 (point 56) should be selected so that coil 52 has an impedance of 50 ohms. Other course, if the power supply required another impedance level, point 56 should be chosen accordingly.

Coil 52 is driven by the RF power supply at a power level of 50 Watts or greater. Under such conditions, plasma generation is at a maximum and uniformity is not a concern. The actual voltage generated by coil 52 depends on a number of factors such as the power used by the RF power supply, length and winding spacing coil 52 and the resistance of the coil among other factors. Since voltage is spread evenly along the coil, determining the voltage level for the entire coil can be done by determining the level between the points at which the coil is connected to ground and the RF power supply (points 55 and 56). For example, if a particular coil is four times as long as the portion of the coil between points 55 and 56, the total voltage of the coil will be four times the voltage level between points 55 and 56.

The coil, power level and applied RF frequency should be selected so that a strong, intense plasma is formed within tube 50, but also so that the voltage generated by coil 52 does not exceed a level at which current will arc from the coil to container 54. It is possible to put an insulating material between container 54 and coil 52 if arcing is a problem for a particular DPA. For simplicity of design, however, it is preferable to have the space between container 54 and coil 52 filled with air.

2. A First Mechanical and Electrostatic Trap Embodiment

Figure 5:
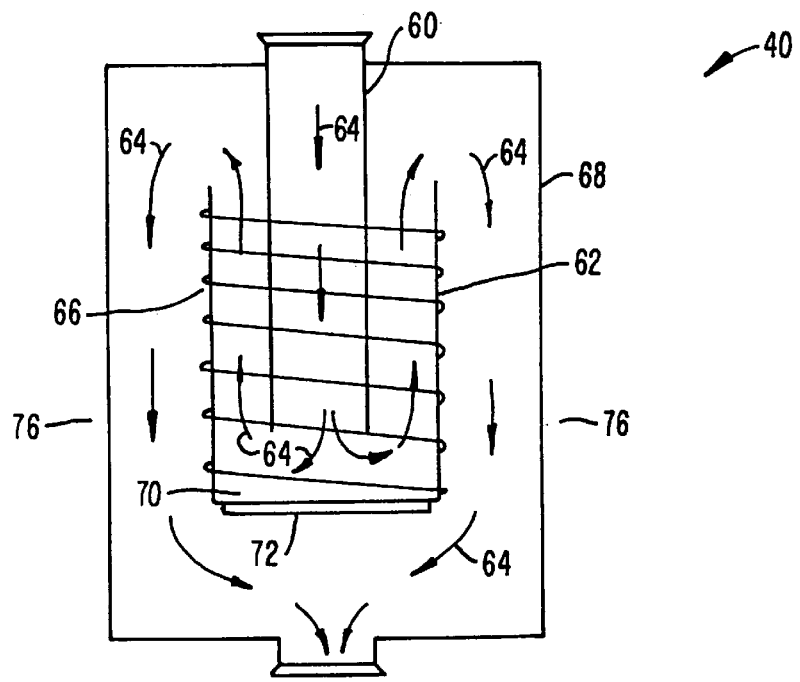
FIG. 5 is a side cross-sectional view of a second embodiment of the vacuum line cleaning apparatus of the present invention.

FIG. 5 is a cross-sectional view of a second embodiment of DPA 40. The embodiment of DPA 40 shown in FIG. 5 includes a first inner ceramic tube 60 and a second outer ceramic tube 62. The end of tube 60 is within the cylindrical space of tube 62 so that gas flow through DPA 40 is as shown in arrows 64.

A helical resonator coil 66 is wrapped around the exterior of tube 62 and connected to an RF power supply 68 as described in relation to the embodiment of FIG. 4. Coil 66 could also be wound within the interior of tube 62 or around the exterior or interior of tube 60.

A shell 68, similar to container 50 above, encloses both inner and outer tubes 60 and 62. Outer tube 62 may be supported by connections to either inner tube 60 or shell 68. In either case, it is important that a support structure for outer tube 62 allow the effluent gas stream to pass through DPA 40. To this end, the support structure may be a plane of ceramic material between tubes 60 and 62 having a plurality of perforated holes, may consist or only three of four slender connections or fingers extending between tubes 60 and 62, or may be designed in numerous other equivalent manners. A structure including perforated holes can help collect and trap particulate matter within a collection area 70 described below. The structure should be designed, however, so that the holes are large enough so as to not reduce the flow rate of gases pumped through DPA 40.

The design of this embodiment of DPA 40 enhances the trapping and therefore decomposition of particulate matter.

The design includes collection area 70 of tube 62 that acts as a mechanical trap collecting and holding particles in the exhaust gas stream so that they cannot pass through the remainder of the DPA into vacuum line 31. The particles are held in the trap and subjected to the plasma until they disassociate or break down under the formed plasma.

The operation of the trap portion of this embodiment of DPA 40 relies in part on gravitational forces that act to hold the particulate matter within the trap despite an effluent gas flow path that attempts to sweep the particles through the DPA device into the vacuum line. Thus, in part, the effectiveness of DPA 40 depends on the ability of exterior tube 62 to prevent particles from leaving tube 62 until they are reacted into gaseous products. To this end, it is important that DPA 40 be positioned so that collection area 70 is downward from the inlet to the DPA and that the length of exterior tube 62 be sufficient to create this trap in combination with gravitational forces.

Increasing the cross-sectional area of the gas passage ways along a plane 76 within DPA 40 further helps trap particulate matter. The rate of flow for an effluent gas stream in any given deposition process is generally constant. Thus, increasing the cross-sectional area of one or more of the passage ways decreases the velocity of particles in the gas stream which correspondingly reduces the neutral drag force on the particles. A given particle is trapped by gravitational forces within the gravity trap of DPA 40, if the gravitational force on the particle exceeds the neutral drag force.

To further enhance the effectiveness of the mechanical trap, an electrostatic collector 72 can be positioned near collection area 70 to attract exhausted particulate matter which is electrically charged. Electrostatic collector 72 may be a small electrode connected to a DC or AC power supply of between 100–3000 volts. Of course the polarity and amount of charge applied to electrostatic collector 72 is application specific and depends on the polarity type and typical charge level of exhausted particulate material in an individual application.

A variety of different electrostatic trapping devices may be employed in the present invention. Details of a second, preferred embodiment of such an electrostatic collector and discussed in detail below with respect to FIGS. 6(*a*) and 6(*b*).

3. A Second Mechanical and Electrostatic Trap Embodiment

Figure 6A:
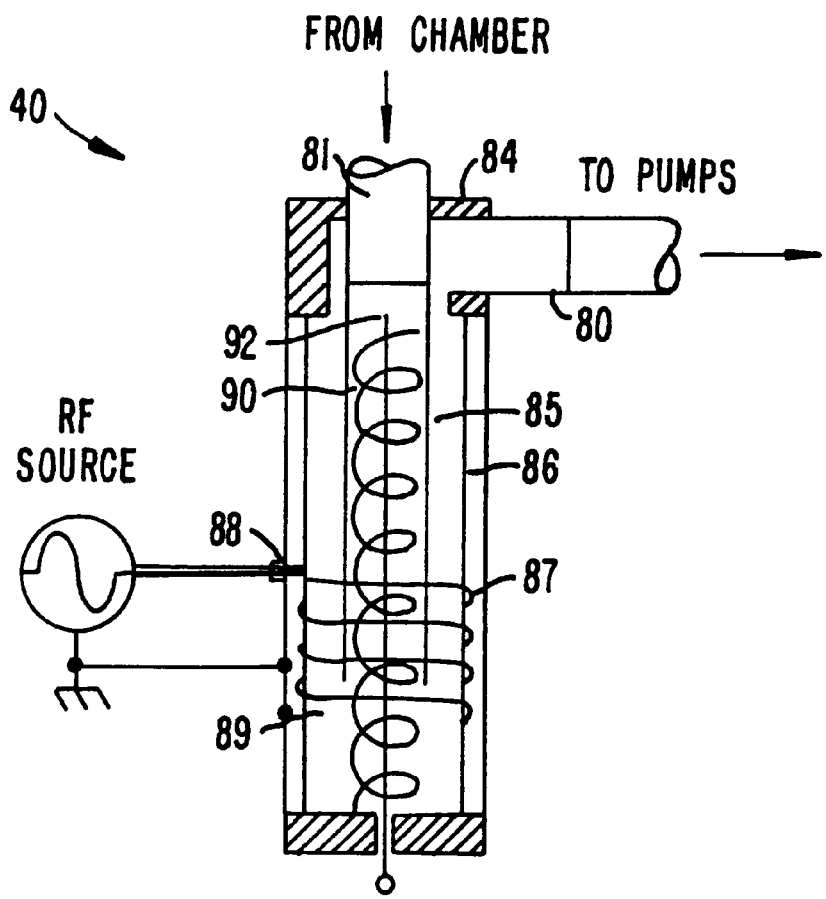
FIG. 6(a) is a side cross-sectional view of a third embodiment of the vacuum line cleaning apparatus of the present invention.
Figure 6B:
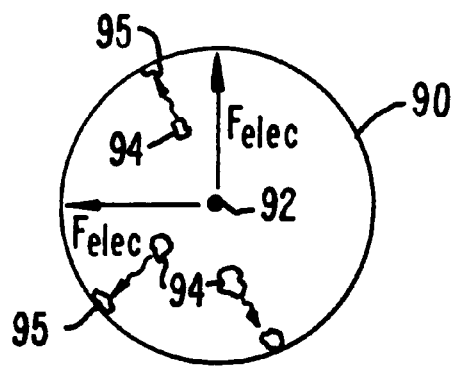
FIGS. 6(b) and 6(c) are diagrams illustrating the effect of the electrostatic trap employed in the apparatus of FIG. 6(a) on a particle pumped into the apparatus.
Figure 6C:
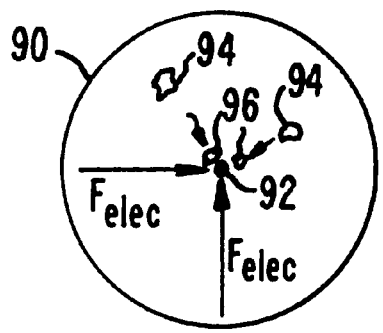

FIG. 6(*a*) is a cross-sectional view of a third embodiment of DPA 40. The embodiment of FIG. 6(*a*) employs a mechanical trap design similar to the embodiment of FIG. 5 and also employs a modified electrostatic trap. Also, effluent gas is exhausted through a side flange 80 located adjacent to upper flange 81 rather than opposite the upper flange. Flange 80 is positioned to create a vacuum seal with outer casing 84 rather than exterior tube 86. Casing 84 is made from a metal or similar material while tube 86 is made out of an insulating material such as ceramic.

RF power is supplied to the DPA of this embodiment through an outer coil 87 that is designed to have an impedance of 50 ohms between the point of connection 88 to the RF supply and point 89 (ground). As above, coil 87 should be designed to have an impedance of 50 ohms so that the coil may be driven by a standard RF power supply. An inner coil 90 is wound within an inner tube 85. Inner coil 90 receives by induction the RF signal supplied on outer coil 87 and creates the voltage field necessary to drive the plasma reaction.

A central wire 92 runs through the center of inner tube 85 and a voltage potential is created between central wire 92 and inner coil 90 to electrostatically trap particulate matter passing through the DPA. The voltage potential can be created using numerous different approaches. In each approach, center wire 92 and coil 90 act as electrodes. In one embodiment, center wire 92 is grounded and a positive DC or AC voltage is applied to coil 90. As shown in FIG. 6(*b*), in the case where exhaust particles 94 are negatively charged, the particles are attracted by the voltage field ($F_{elec}$) created by wire 92 and coil 90 and collect at positions 95 on the positively charged coil. A similar result can be achieved if coil 90 is grounded and a negative voltage is applied to center wire 92. In this case, however, wire 92 repels negatively charged particles toward coil 90.

In another embodiment, a positive DC or AC voltage is applied to center wire 92 and coil 90 is connected to a ground potential. In this approach, the negatively charged particles are collected at positions 96 on positively charged wire 92 as shown in FIG. 6(*c*). A similar result can be achieved if a negative voltage is applied to coil 90 and center wire 92 is grounded. In this case, coil 90 repels the negatively charged particles toward wire 92.

In still other embodiments, neither wire 92 or coil 90 are grounded and instead both are connected to voltage sources that create a positive or negative voltage from wire 92 relative to coil 90. Of course, in the case where positively charged particulate matter is present, this matter may be collected on the electrode opposite the electrode the negatively charged matter is collected on.

Also, particles may be collected by electrostatic forces in cases where the particulate matter includes both positively and negatively charged particles. In such a case, it is preferable to apply an AC voltage to one electrode and ground the other. For example, when an AC voltage is connected to center wire 92 and coil 90 is grounded, positive particulate matter is repelled from the wire toward coil 90 during the positive half-cycle. During the negative half-cycle, however, negative particulate matter is repelled from the wire and collected on coil 90.

In any of the above cases, the electric field can be a voltage between the two electrodes of between 100 and 5000 volts. Preferably, the voltage between the electrodes is between 500 volts (DC) to 5000 volts (AC). Whether particles are attracted away from central wire 92 to collect on coil 90 or vice versa depends on the polarity of the particles and the charges applied to coil 90 and wire 92.

Because this design relies on the voltage potential created between coil 90 and center wire 92, coil 90 should be positioned inside inner tube 85 to obtain maximum particle collection so as to not be separated from wire 92 by the insulating material of the tube. Being situated inside tube 85, coil 90 and center wire 92 come in contact with a variety of highly reactive species such as fluorine. Accordingly, it is important that coil 90 and wire 92 be made of a suitable conductive material, such as nickel, that does not react with such species. It is important to note that coil 90 carries both a voltage potential to attract or repel particles and RF power signal in this embodiment.

The electrostatic collector and mechanical trap combination provides a particularly effective mechanism to prevent deposition build up in vacuum line 31. The mechanical trap section is particularly effective in trapping relatively large particles present in the effluent gas stream because these particles are more likely to be held within exterior tube 62 by gravitational forces. The electrostatic trap, on the other hand, is particularly effective at collecting and trapping smaller particles in the effluent gas stream that may otherwise not be collected by just the mechanical trap.

As an example, in the deposition of silicon nitride as described above, particles ranging in size from 1 μm in diameter to 1 mm in diameter or more have been observed. When these particles are in the exhaust line, two forces of importance act on the particles: a gravitational attraction force ($F_g$) and a neutral drag force ($F_{nd}$) resulting from the gas motion. For large particulate matter, such as particles larger than 100 μm in diameter, the major interaction is the gravitational force, so the mechanical trap is particularly effective. For smaller particles, however, the drag force of the gas can be higher than the gravitational force. Consequently, the electric field developed between the two electrodes of the electrostatic trap applies a supplementary force ($F_{elec}$), perpendicular to the trajectory of the particulate. This force can be two or more orders of magnitude larger than both the gravitational and drag forces for very small particulates, such as those less than 10 μm in diameter, resulting in a very high collection efficiency.

IV. Experimental Use and Test Results

To demonstrate the effectiveness of the present invention, experiments were performed in which a prototype DPA 40 was attached to a Precision 5000 chamber outfitted for 8 inch wafers. The Precision 5000 chamber is manufactured by Applied Materials, the assignee of the present invention.

Figure 7:
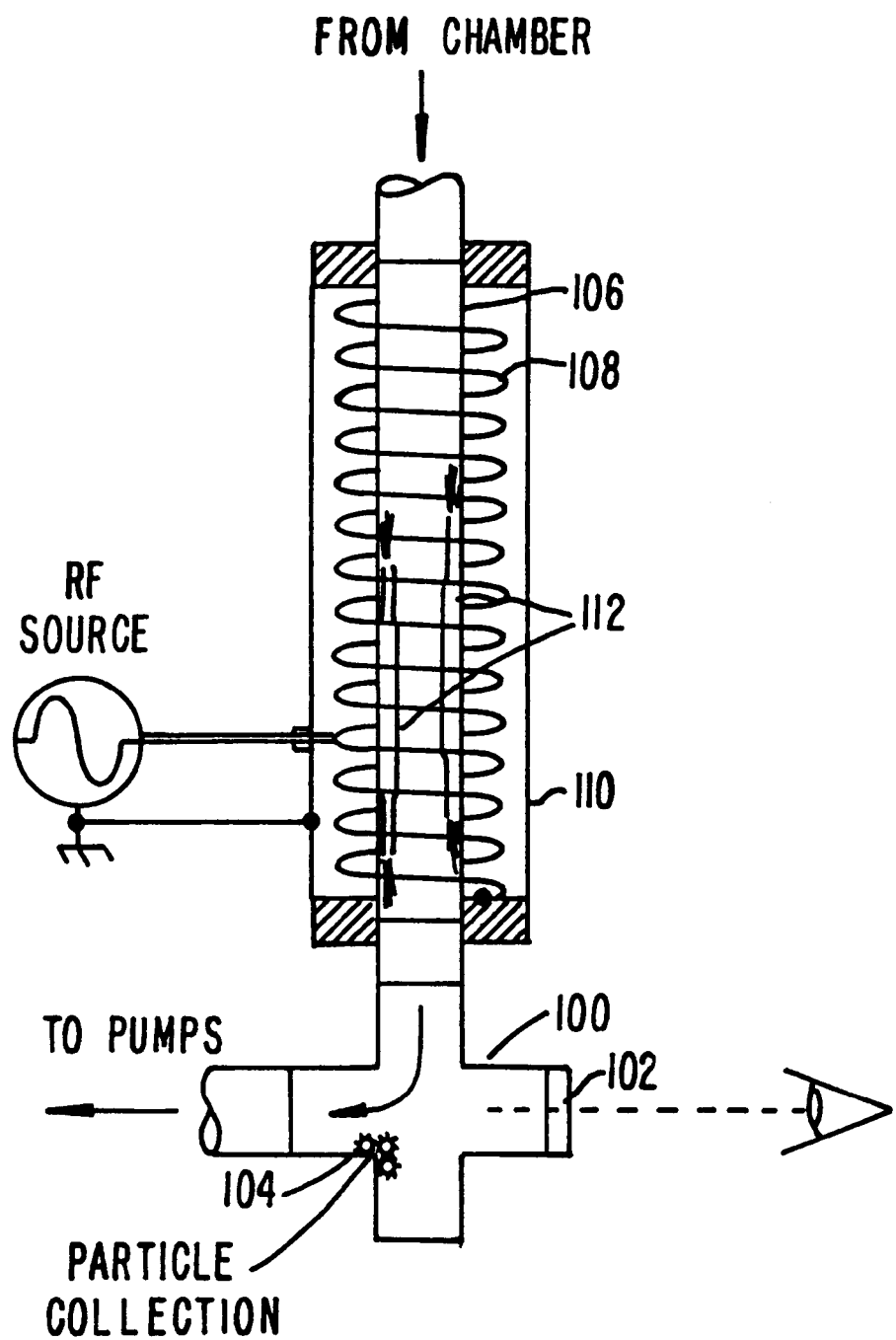
FIG. 7 is a side cross-sectional view of a prototype of the apparatus of the present invention used in performing tests evaluating the effectiveness of the invention.

In the experiments, the prototype DPA was similar to DPA 40 shown in FIG. 3 except for the design of the lower flange used to connect the DPA to the foreline. A cross-sectional view of the prototype DPA and lower flange is shown in FIG. 7. As shown in FIG. 7, a lower flange 100 redirected the exhaust gases flowing through the DPA into the foreline at an angle of approximately 90 degrees. The flange also was fitted with a quartz window opposite the foreline connection so that deposition material that built-up on a bottom portion 104 of flange could be observed. This design of the lower flange in the prototype DPA had the added benefit of trapping particulate matter in area 104 in a manner similar to but not as effective as the mechanical bucket trap designs in the embodiments of DPA 40 shown in FIGS. 5 and 6.

The prototype device included a quartz tube 106 having a coil 108 made out of ⅜ inch copper tubing wrapped around the exterior of the quartz tube. The total length of coil 108 was approximately 25 feet and a 13.56 MHz power supply was driven at various power levels as explained in the description of the experiments below. Quartz tube 106 and coil 108 were sealed within an aluminum container 110. The entire length of the assembly was approximately 14 inches, and the width of the assembly was approximately 4.5 inches.

Before experiments were performed testing the effectiveness of the DPA, experiments were performed to determine the composition of residue deposited in the processing chamber by a silicon nitride deposition step followed by a fluorine clean step. The composition of the residue was determined for two different silicon nitride deposition/fluorine clean operations process sequences. In each process sequence, the silicon nitride deposition step was identical while the clean step was based on a $CF_4$ chemistry in the first sequence and on an $NF_3$ chemistry in the second sequence.

The silicon nitride film was deposited on a wafer by subjecting the wafer to a plasma of silane ($SiH_4$), nitrogen ($N_2$) and ammonia ($NH_3$) gases. $SiH_4$ was introduced into the chamber at a flow rate of 275 sccm, $N_2$ was introduced into the chamber at a rate of 3700 sccm and $NH_3$ was introduced at a rate of 100 sccm. The plasma was formed at a pressure of 4.5 torr, at a temperature of 400° C., using a 13.56 MHz RF power supply driven at 720 Watts. The silicon nitride deposition process deposited lasted approximately 75 seconds which was sufficient to deposit a film of approximately 10,000 Å on the wafer.

For the first measurement, after the silicon nitride deposition step was completed and the wafer removed from the chamber, the chamber was cleaned with a $CF_4$ and $N_2O$ plasma for 120 seconds. The ratio of $CF_4$ to $N_2O$ was 3:1 with the $CF_4$ being introduced at a rate of 1500 sccm and $N_2O$ being introduced at a rate of 500 sccm. During the clean step, the chamber was maintained at a temperature of 400° C. and at a pressure of 5 torr. The plasma was formed with a 13.56 MHz power supply powered at 1000 Watts.

For the second measurement, the chamber was cleaned with a plasma formed from $NF_3$ and $N_2O$ and $N_2$ precursor gases. The ratio of $NF_3$ to $N_2O$ was approximately 5:2:10 with $NF_3$ being introduced at a rate of 500 sccm, $N_2O$ being introduced at a rate of 200 sccm, and $N_2$ being introduced at a rate of 1000 sccm. The chamber was maintained at a temperature of 400° C. and a pressure of 5 torr during the clean step, which lasted for approximately 95 seconds. Plasma formation was achieved with a 13.56 MHz power supply powered at 1000 Watts.

As evident in Table 1 below, the residue build-up from the silicon nitride deposition/$CF_4$ chamber clean process sequence was a brownish powder while the residue build-up from the silicon nitride deposition/$NF_3$ chamber clean sequence was a yellow-white powder.

TABLE 1

Residue Formation From Silicon Nitride Deposition/Fluorine Clean Processes

| Cleaning Process | Residue Type | Residue Composition | | | | | |
|---|---|---|---|---|---|---|---|
| | | C at % | O at % | N at % | Si at % | F at % | H at % |
| $CF_4 + N_2O$ | brown powder | 0.2 | 6.8 | 13 | 42 | 1 | 37 |
| $NF_3 + N_2O + N_2$ | yellow-white powder | 0 | 1 | 12 | 8.5 | 38.5 | 40 |

Figure 8:
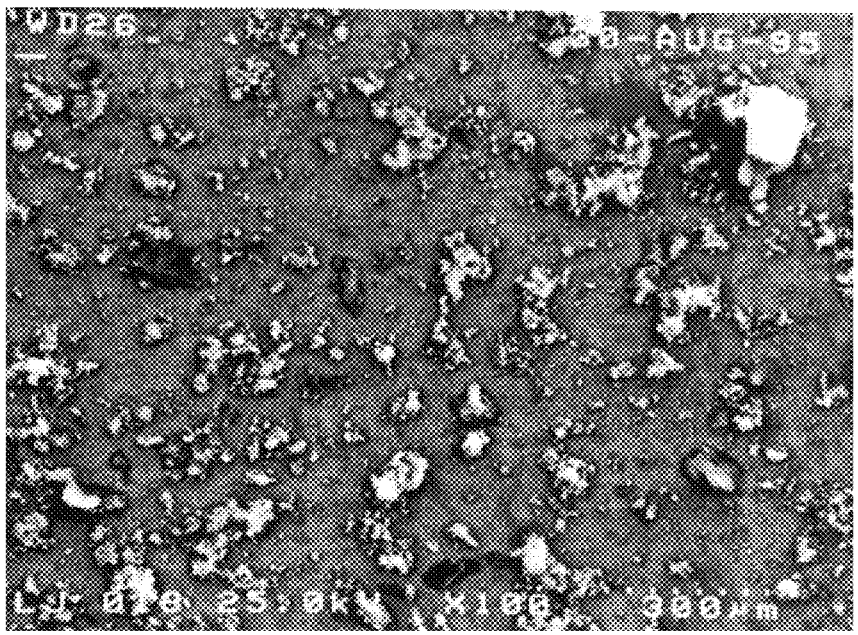
FIG. 8 is a micrograph showing the amount of residue build-up on a silicon piece inside the vacuum foreline after a 15 second silicon nitride deposition process.
Figure 9:
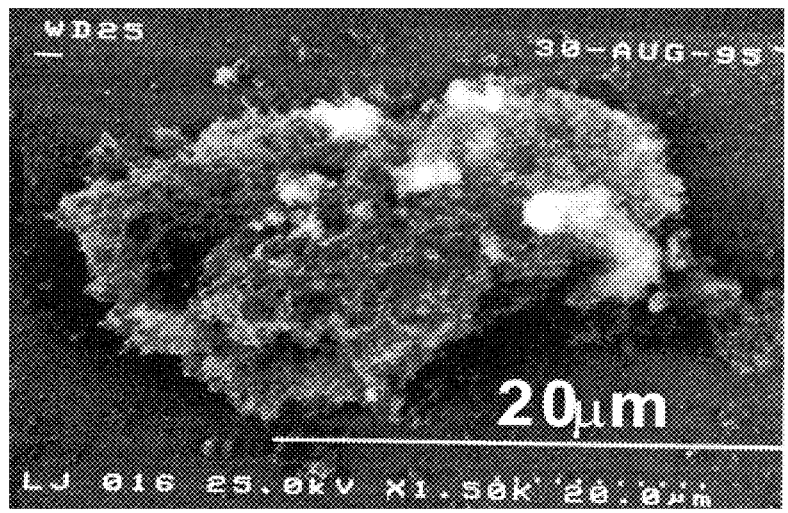
FIG. 9 is a micrograph showing the size of particulate matter deposited on a silicon piece inside the vacuum foreline during an experiment performed prior to testing the present invention.

After the composition of residue build-up in the chamber was determined, an experiment was performed to determine the grain size of the residual powder. For this experiment, a silicon piece was placed within the foreline to collect material deposited there from the deposition process. It was observed that even after a 15 second deposition process, a residue build-up in the form of a brown powder normally occurs in vacuum line 3. A micrograph showing this residue build-up is shown as FIG. 8. The brown powder was made up of $Si_xN_yH_z$, $Si_xH_y$, $SiO_x$ and elemental silicon residues. As shown in FIG. 9, a micrograph of a typical residue particle, the elementary grain size of the powder was approximately 1–50 μm in diameter. Further experiments showed that the grain size of the powder increased with deposition time to form aggregates as large as 1 mm in diameter for a 90 second deposition step.

The effectiveness of the DPA was tested in three separate experiments. In each experiment 100 wafers were processed in a silicon nitride deposition/$CF_4$ fluorine clean operation sequence performed in a Precision 5000 chamber having the prototype DPA connected between the vacuum exhaust manifold and the foreline. The prototype the DPA was kept OFF during the deposition sequence of each experiment and was turned ON and powered by a 13.56 RF power supply during the fluorine clean sequence. When OFF during deposition, particles collected along the interior of tube 106 as shown in FIG. 7 as areas 112. These particles were then removed from tube 106 when the DPA was activated during the clean sequence. The conditions for each of the three experiments are summarized in Table 2 below.

TABLE 2

Foreline Cleaning Results

|  | Experiment 1 | Experiment 2 | Experiment 3 |
|---|---|---|---|
| RF Frequency | 13.56 MHz | 13.56 MHz | 13.56 MHz |
| RF Power | 200 | 500 | 500 |
| $CF_4$ Flow | 1500 | 2000 | 2500 |
| $N_2O$ Flow | 500 | 500 | 500 |
| Result | Residue #1 in Table 3 | Residue #2 in Table 3 | Residue Exterminated |

In the first experiment, the fluorine clean sequence was 135 seconds and the DPA was driven at 200 Watts. $CF_4$ was introduced into the processing chamber at a rate of 1500 sccm and mixed with $N_2O$ introduced into the chamber at a rate of 500 sccm (a 3:1 ratio). After 100 deposition/clean sequences, the DPA was examined and found to be free of all residue and deposits. In the angular flange at the bottom of the DPA, a small amount of a residue build-up had collected. The atomic concentration of this residue build-up was measured and is summarized in Table 3 below. The majority of silicon in the residue was contained in the form of silicon oxide and approximately half the nitrogen was contained in a silicon nitride film with the other half being in the form of ammonia.

In the second experiment, the fluorine clean sequence was shortened to 120 seconds and voltage at which the DPA was driven was increased to 500 Watts. $CF_4$ was introduced into the processing chamber at a rate of 2000 sccm and mixed with $N_2O$ introduced into the chamber at a rate of 500 sccm (a 4:1 ratio). After 100 deposition/clean sequences, the DPA was examined and found to be free of all residue and deposits. A small amount of a residue build-up had collected in the angular flange. From a visual inspection, the amount of residue build-up was approximately 80% less than the amount of build-up in the first experiment, however.

The atomic concentration of this residue build-up was measured and is also summarized in Table 3 below. As evident from the table, the residue from this experiment contained a significantly higher concentration of fluorine than the residue from the first experiment. The fluorine concentrated residue provides more fluorine species for the plasma and thus makes the residue easier to clean during further DPA activation. It should also be noted that the overwhelming majority of silicon in the residue from this experiment was contained in the form of silicon oxide and the overwhelming majority of nitrogen was present in the form of ammonia.

The third experiment proved that the residue can be completely eliminated from both the DPA and the angular flange where residue tended to collect during the first and second experiments. In this third experiment, the fluorine clean sequence was 120 seconds long and voltage at which the DPA was driven was increased to 500 Watts. The rate at which $CF_4$ was introduced into the processing chamber was increased to 2500 sccm and mixed with $N_2O$ introduced into the chamber at a rate of 500 sccm (a 5:1 ratio). After 100 deposition/clean sequences, the DPA and angular flange were examined and both were found to be free of all residue and deposits.

The results of these experiments in the way of residue presence and composition is summarized in Table 3 below.

TABLE 3

Residue Collected at Bottom of DPA

|  | Atomic concentration % |  |  |  |  |  | Si % present as |  |  | N % present as |  |
|---|---|---|---|---|---|---|---|---|---|---|---|
|  | C | O | N | Si | F | H | elem. | nit. | ox. | nitride | $NH_3$ |
| Residue #1 | 3.4 | 44.8 | 7.4 | 31.4 | 13.1 | N/A | 13.9 | 20 | 66.1 | 48.6 | 51.4 |
| Residue #2 | 4.8 | 20.5 | 15.2 | 19.8 | 39.8 | N/A | 4.2 | 3.3 | 92.5 | 3.7 | 96.3 |
| Residue #3 | NONE | NONE | NONE | NONE | NONE | NONE | NONE | NONE | NONE | NONE | NONE |

Having fully described several embodiments of the present invention, many other equivalent or alternative devices for and methods of removing particulate matter from a vacuum line according to the present invention will be apparent to those skilled in the art. Additionally, although the present invention has been described in some detail by way of illustration and example for purposes of clarity and understanding, it will be obvious that certain changes and modifications may be practiced. For example, while the mechanical particle trap of the present invention was described with respect an inner passage way surrounded by an outer passage way, the trap could be created with a first passage way perimetrically contained within a second passage way, but instead extending away from or upward the first passage way. These equivalents and alternatives along with the understood obvious changes and modifications are intended to be included within the scope of the present invention.

What is claimed is:

1. A semiconductor processing apparatus comprising:
   a housing for forming a processing chamber, said housing having an exhaust port for exhausting gases from said processing chamber;
   a substrate support adapted to support a substrate within said processing chamber;
   a gas distribution system configured to introduce gases into said processing chamber;
   a heater configured to heat said substrate;
   a vacuum system configured to control the pressure within said processing chamber;
   an exhaust line, coupled to said exhaust port and to said vacuum system, through which gases are exhausted from said processing chamber; and
   a particle collector, coupled to said exhaust line, for trapping and removing particulate matter present in gases exhausted from said processing chamber to prevent build-up of deposition material within said exhaust line, said particle collector comprising a vessel chamber defining a gas passageway having an inlet and an outlet and a collection area between the inlet and the outlet, the collection area being structured and arranged to collect particulate matter flowing through the gas passageway and to inhibit egress of the particulate matter from the particle collector; and a plasma formation system, operatively coupled to form a plasma within at least a portion of said gas passageway in order to remove particulate matter deposited or trapped within said gas passageway.

2. The apparatus of claim 1 wherein said plasma formation system comprises a coil, surrounding at least a portion of said gas passageway, and an RF power supply, operatively coupled to said coil, for supplying RF power to said coil.

3. The apparatus of claim 1 wherein vessel chamber defines a flow passage communicating the collection area with the outlet, the flow passage extending at least partially upwards from the collection chamber to inhibit egress of the particulate matter from the chamber.

4. The apparatus of claim 3 wherein the collection area is defined by a first, lower wall in communication with the inlet of the gas passageway and a second, perimetrical wall contiguous with and extending upwardly from the first wall.

5. The apparatus of claim 4 wherein the vessel chamber comprises a shaft defining an inner lumen in communication with the gas passageway inlet and having a lower opening communicating with and vertically spaced above the first wall of the collection area for discharging particulate matter into the area, the perimetrical wall circumscribing the shaft and defining an annular, vertical flow passage therebetween in communication with the outlet of the gas passageway.

6. The apparatus of claim 5 wherein the perimetrical wall defines an outlet port in communication with the annular flow passage for discharging the gaseous products from the vessel chamber, the outlet port being vertically spaced above the collection area.

7. The apparatus of claim 5 further comprising an outer housing surrounding the shaft and the collection area, the outer housing defining a receiving chamber in communication with the annular, vertical flow passage and an outlet port in communication with the receiving chamber for discharging the gaseous products from the vessel chamber, the outlet port being vertically spaced below the collection area.

8. The apparatus of claim 1 further comprising an electrostatic collector, coupled to said vessel chamber, to collect electrically charged particulate matter that may be present in gases passing through said vessel chamber.

9. The apparatus of claim 8 wherein said electrostatic collector is positioned with said collection area.

10. The apparatus of claim 1 wherein said vessel chamber comprises a first passageway defining a path of flow in a first direction for gases passing through said vessel chamber and a second passageway defining a flow path in a second direction different from said first direction, said first and second passageways being arranged such that gases flow into said vessel chamber through said inlet port, through said first passageway, through said second passageway and then exit said vessel chamber through said outlet port.

11. The apparatus of claim 10 wherein said first passageway and second passageway are designed to create said collection area to trap particulate matter that may be present in gasses passing through said vessel chamber.

12. The apparatus of claim 11 wherein said first direction is substantially opposite said second direction.

13. A method of minimizing deposition within an exhaust line connected to a semiconductor processing chamber, said method comprising;
    passing gases exhausted from said processing chamber through a vessel chamber defining a gas passageway that is fluidly coupled to said exhaust line;
    trapping particulate matter present in said exhausted gases within said gas passageway with an electrostatic collector; and
    striking a plasma in said gas passageway to remove particulate matter deposited or trapped within said vessel chamber.

14. The method of claim 13 wherein said step of trapping said particulate matter is performed in conjunction with a substrate processing operation performed in the substrate processing chamber and wherein said step of striking said plasma is performed in conjunction with a clean operation of the substrate processing chamber.

15. The method of claim 14 wherein said substrate processing operation comprises a step of depositing a layer of material by chemical vapor deposition.

16. In a processing chamber in which silicon nitride is deposited by chemical vapor deposition onto a substrate, a method of minimizing residue build-up from said silicon nitride deposition in an exhaust line coupled to said processing chamber, said method comprising the steps of:
    pumping gases exhausted from said processing chamber through a vessel defining a fluid conduit having an inlet and an outlet;
    collecting particulate matter present in said exhausted gases in a collection area between the inlet and outlet of said vessel;
    forming a plasma in said collection area to react said collected particulate matter into gaseous products; and
    pumping said gaseous products from said vessel.

17. The method of claim 16 wherein said particulate matter comprises partially reacted silicon containing products and byproducts from said silicon nitride deposition.

18. The method of claim 17 wherein partially reacted silicon containing products and byproducts comprise $Si_xN_yH_z$, $Si_xH_y$, $SiO_x$ and elemental silicon.

19. The method of claim 16 wherein said plasma is formed during a chamber clean operation in which a reactant gas is introduced into said processing chamber and pumped through said vessel to etch material deposited from said silicon nitride deposition step.

20. The method of claim 19 wherein said plasma formation is selectively turned ON and OFF during operation of said processing chamber.

21. The method of claim 20 wherein said plasma formation is turned OFF during deposition of said silicon nitride film and turned ON during said chamber clean operation.

22. The method of claim 21 wherein said ON and OFF sequence is performed sequentially for deposition of silicon nitride layers on a plurality of wafers.

23. The method of claim 16 wherein said collecting step uses gravitation forces to collect particles in said collection area.

24. The method of claim 16 wherein said collecting step uses electrostatic forces to collect particles in said collection area.

25. The method of claim 16 wherein said collecting step uses gravitational and electrostatic forces to collect particles in said collection area.

26. The method of claim 16 wherein said step of forming a plasma forms said plasma by applying RF power to a coil surrounding said collection area.

27. The method of claim 26 wherein said RF power is continuously supplied to said coil during sequential deposition and clean steps for a plurality of wafers.

28. In a substrate processing chamber in which a layer is deposited by chemical vapor deposition onto a substrate, a method of minimizing build-up of residue from said chemical vapor deposition step in an exhaust line coupled to said processing chamber, said method comprising:

pumping gases exhausted from said processing chamber during said chemical vapor deposition step through a vessel defining a fluid conduit having an inlet and an outlet;

collecting particulate matter present in said exhausted gases in a collection area between the inlet and outlet of said vessel during said chemical vapor deposition step;

forming a plasma in said collection area during a clean operation in said substrate processing chamber to convert said particulate matter collected in said collection area into gaseous products; and pumping said gaseous products from said vessel.

29. A method of minimizing residue build-up within an exhaust line connected to a substrate processing chamber, said method comprising:

exhausting gases from said substrate processing chamber through a collection chamber fluidly coupled to an outlet of said substrate processing chamber;

collecting particulate matter from said exhausted gases in said collection chamber;

forming a plasma in said collection chamber to react said collected particulate matter into gaseous products; and pumping said gaseous products from said collection chamber.

30. The method of claim 29 wherein said particulate matter comprises partially reacted silicon containing products and byproducts.

31. The method of claim 29 wherein said plasma is formed during a chamber clean operation in which an etchant gas is introduced into said processing chamber and pumped through said collection chamber.

32. The method of claim 29 wherein said plasma is selectively ignited and extinguished during operation of said processing chamber.

33. The method of claim 29 wherein said plasma in said collection chamber is formed during a chamber clean operation and not formed during a film deposition step.

34. The method of claim 29 wherein said particulate matter is collected in said collection chamber using gravitation forces.

35. The method of claim 29 wherein said particulate matter is collected in said collection chamber using electrostatic forces.

36. The method of claim 29 wherein said particulate matter is collected in said collection chamber using a combination of gravitational and electrostatic forces.

37. The method of claim 29 wherein said particulate matter is collected in said collection chamber in conjunction with a substrate processing operation performed in the substrate processing chamber and wherein said plasma is formed in said collection chamber in conjunction with a clean operation of the substrate processing chamber.

38. The method of claim 37 wherein said substrate processing operation comprises a depositing a layer of material by chemical vapor deposition over a substrate disposed in said substrate processing chamber.

39. The method of claim 29 wherein said collection chamber includes a fluid conduit having a plurality of bends.

40. The method of claim 39 wherein a portion of said fluid conduit forms a serpentine path.

* * * * *